(12) United States Patent
Song

(10) Patent No.: US 9,140,741 B2
(45) Date of Patent: Sep. 22, 2015

(54) INTEGRATED CIRCUIT CHIP AND MEMORY DEVICE HAVING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 303 days.

(21) Appl. No.: 13/720,191

(22) Filed: Dec. 19, 2012

(65) Prior Publication Data
US 2014/0003174 A1    Jan. 2, 2014

(30) Foreign Application Priority Data

Jun. 28, 2012    (KR) .................. 10-2012-0069893

(51) Int. Cl.
| | |
|---|---|
| G06F 11/00 | (2006.01) |
| G01R 31/30 | (2006.01) |
| G01R 31/04 | (2006.01) |
| G11C 29/00 | (2006.01) |
| G11C 29/12 | (2006.01) |
| G11C 29/48 | (2006.01) |

(52) U.S. Cl.
CPC .............. *G01R 31/041* (2013.01); *G11C 29/00* (2013.01); *G11C 29/1201* (2013.01); *G11C 29/48* (2013.01); *G01R 31/046* (2013.01)

(58) Field of Classification Search
CPC .... G01R 31/041; G01R 31/04; G01R 31/043; G01R 1431/046; G01R 31/318558; G01R 31/318563; G01R 31/31715; G11C 29/1201; G11C 29/00; G11C 19/48
USPC ......... 714/735, 724–727, 733–734, 742, 819, 714/823, 799, 721, 718; 326/433, 522, 523, 326/527, 537, 755, 756, 765, 761; 365/189.02–189.04, 189.14–189.15, 365/189.2, 189.05, 189.08, 189.09, 207
See application file for complete search history.

(56) References Cited

U.S. PATENT DOCUMENTS

| | | | | |
|---|---|---|---|---|
| 4,493,077 | A  * | 1/1985 | Agrawal et al. ................ | 714/731 |
| 5,442,301 | A  * | 8/1995 | Nasu ......................... | 324/762.02 |
| 7,793,180 | B1 * | 9/2010 | Shrivastava .................... | 714/726 |
| 2006/0005091 | A1* | 1/2006 | Mitra et al. ................... | 714/726 |
| 2006/0220703 | A1 | 10/2006 | Wang et al. | |
| 2009/0132879 | A1* | 5/2009 | Gangappa ..................... | 714/729 |

OTHER PUBLICATIONS

JEDEC Standard, DDR4 SDRAM, JESD79-4, Sep. 2012, pp. 135-137, JEDEC Solid State Technology Association.

* cited by examiner

*Primary Examiner* — Christine Tu
(74) *Attorney, Agent, or Firm* — IP & T Group LLP

(57) ABSTRACT

An integrated circuit chip includes a plurality of test input pads configured to receive a plurality of test input signals, a plurality of single-ended type buffers configured to receive signals input to the plurality of test input pads in a connectivity test mode, a plurality of differential-type buffers configured to receive signals input to the plurality of test input pads in a normal mode, a signal combination unit configured to combine the plurality of test input signals input through the plurality of single-ended type buffers, and to generate a plurality of test output signals, and a plurality of test output pads configured to output the plurality of test output signals in the connectivity test mode.

11 Claims, 4 Drawing Sheets

INTEGRATED CIRCUIT CHIP AND MEMORY DEVICE HAVING THE SAME

CROSS-REFERENCE TO RELATED APPLICATIONS

The present application claims priority of Korean Patent Application No. 10-2012-0069893, filed on Jun. 28, 2012, which is incorporated herein by reference in its entirety.

BACKGROUND

1. Field

Exemplary embodiments of the present invention relate to an integrated circuit chip and a memory device having the same, and more particularly, to a technology of testing whether each pad (pin) of an integrated circuit chip is electrically connected to a substrate (board).

2. Description of the Related Art

When an integrated circuit chip such as a memory device is attached to a board, a test is performed to check a bonding state regarding whether bonding of a package is made and pins are connected to the board, in a desired manner. The conventional art uses a scheme of testing a bonding state of a board and pins using a test scheme called a boundary scan test. However, since this scheme performs a test by shifting a test pattern, a much longer test time may be required.

In a recent memory device, a connectivity test scheme of simultaneously applying signals to a plurality of pads of a chip and testing an electrical connection state of the pads in a parallel manner has been proposed. In this regard, a chip design of stably supporting a connectivity test of new scheme may be required.

SUMMARY

Exemplary embodiments of the present invention are directed to an integrated circuit chip that ensures a stable operation while supporting a connectivity test scheme of quickly testing an electrical connection state of a plurality of pads.

In accordance with an embodiment of the present invention, an integrated circuit chip includes a plurality of test input pads configured to receive a plurality of test input signals, a plurality of single-ended type buffers configured to receive signals input to the plurality of test input pads in a connectivity test mode, a plurality of differential-type buffers configured to receive signals input to the plurality of test input pads in a normal mode, a signal combination unit configured to combine the plurality of test input signals input through the plurality of single-ended type buffers, and to generate a plurality of test output signals, and a plurality of test output pads configured to output the plurality of test output signals in the connectivity test mode.

In accordance with another embodiment of the present invention, a memory device includes a chip select pad, a plurality of control pads, a plurality of command pads, a plurality of address pads; a plurality of single-ended type buffers configured to receive signals input to the chip select pad, the plurality of control pads, the plurality of command pads, and the plurality of address pads, in a connectivity test mode, a plurality of differential-type buffers configured to receive signals input to the chip select pad, the plurality of control pads, the plurality of command pads, and the plurality of address pads, in a normal mode; a signal combination unit configured to combine a plurality of test input signals, which are input through single-ended type buffers corresponding to the plurality of control pads, the plurality of command pads, and the plurality of address pads, in the connectivity test mode, and to generate a plurality of test output signals, and an output circuit configured to output the plurality of test output signals through a plurality of data pads and a plurality of strobe pads in response to a chip select signal input through a single-ended type buffer corresponding to the chip select pad, in the connectivity test mode.

According to the present invention, differential-type buffers and single-ended type buffers are coupled to input pads used in a connectivity test mode and optimal buffers among differential-type buffers and single-ended type buffers are selected for use, so that it is possible to reduce current consumption and simultaneously to perform a stable operation.

DETAILED DESCRIPTION

Figure 1:
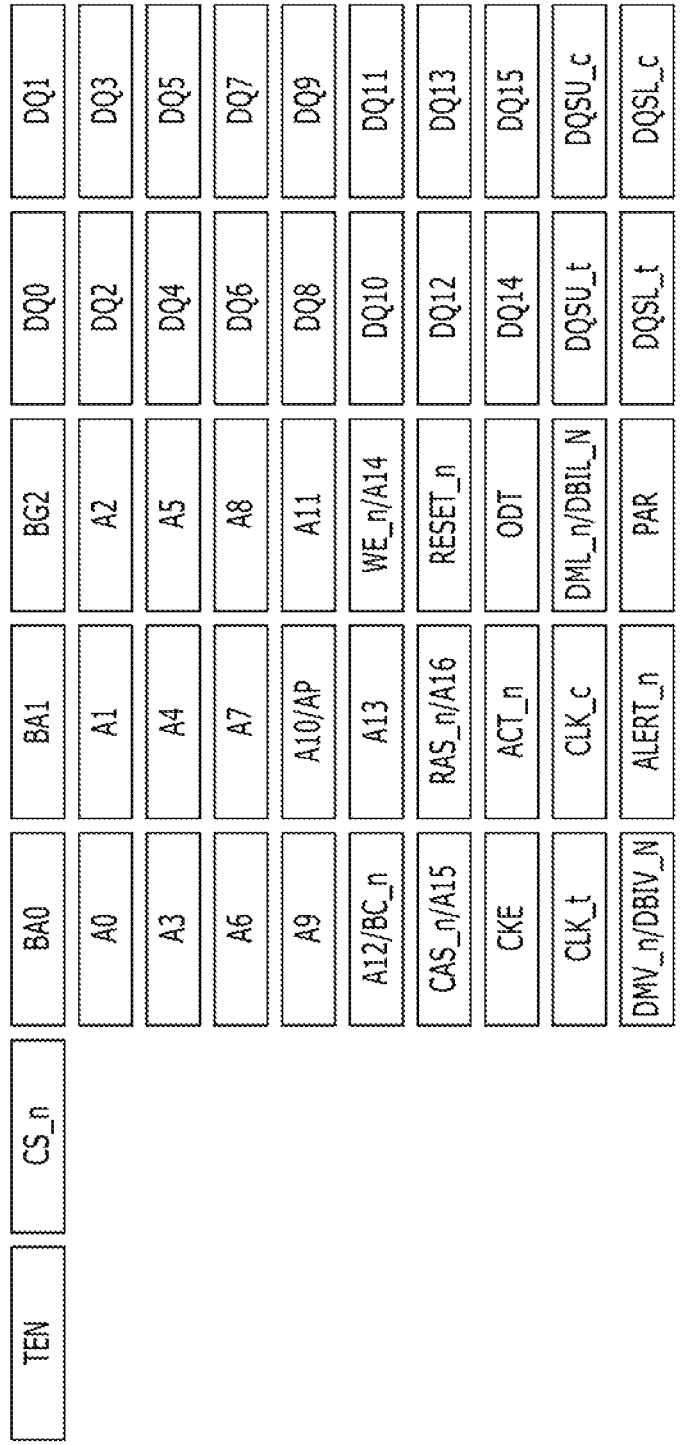
FIG. 1 is a diagram illustrating package pins (pads) used in a connectivity test of a memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram illustrating package pins (pads) used in a connectivity test of a memory device.

The pads (pins) are used according to purposes thereof in the connectivity test, which will be described hereinafter.

1. A test enable pad: this pad is used to enable a connectivity test mode for a connectivity test. The test enable pad is indicated by TEN.

2. Chip select pad: a signal input to this pad is related to output of test output signals in the connectivity test. When a signal input to the chip select pad CS_n has a 'low' level, the test output signals are output to test output pads, and when the signal input to the chip select pad CS_n does not have a 'low' level, the test output pads are tri-stated.

3. Test input pads: in the connectivity test mode, input signals for the connectivity test are input to the test input pads. The test input pads include $0^{th}$ and first bank address pads BA0 and BA1, a $0^{th}$ bank group address pad BG0, $0^{th}$ to ninth address pads A0 to A9, a tenth address/auto-precharge pad A10/AP, an eleventh address pad A11, a twelfth address/burst chop pad A12/BC_n, a thirteenth address pad A13, a write enable/fourteenth address pad WE_n/A14, a column address strobe/fifteenth address pad CAS_n/A15, a row address strobe/sixteenth address pad RAS_n/A16, a reset pad RESET_n, a clock enable pad CKE, an active pad ACT_n, an on-die termination pad ODT, a dock pad CLK_t, a clock bar pad CLK_c, a data mask low/data bus inversion low pad DML_n/DBIL_n, a data mask up/data bus inversion up pad DMU_n/DBIU_n, an alert pad ALERT_n, and a parity pad PAR. Among these pads, the pads BA0, BA1, BG0, A0 to A9, A10/AP, A11, A12/BC_n, and A13 are classified into address pads, the pads WE_n/A14, CAS_n/A15, RAS_n/A16, and ACT_n are classified into command pads, and the pads CKE, ODT, CLK_t, CLK_c, DML_n/DBIL_n, DMU_n/DBIU_n, ALERT_n, PAR, and RESET_n are classified into control pads.

4. Test output pads in the connectivity test mode, test output signals generated by logically combining signals input to the test input pads are output to the test output pads. The test output pads include 16 data pads DQ0 to DQ15 and four strobe pads DQSU_t, DQSU_c, DQSL_t, and DQSL_c.

Figure 2:
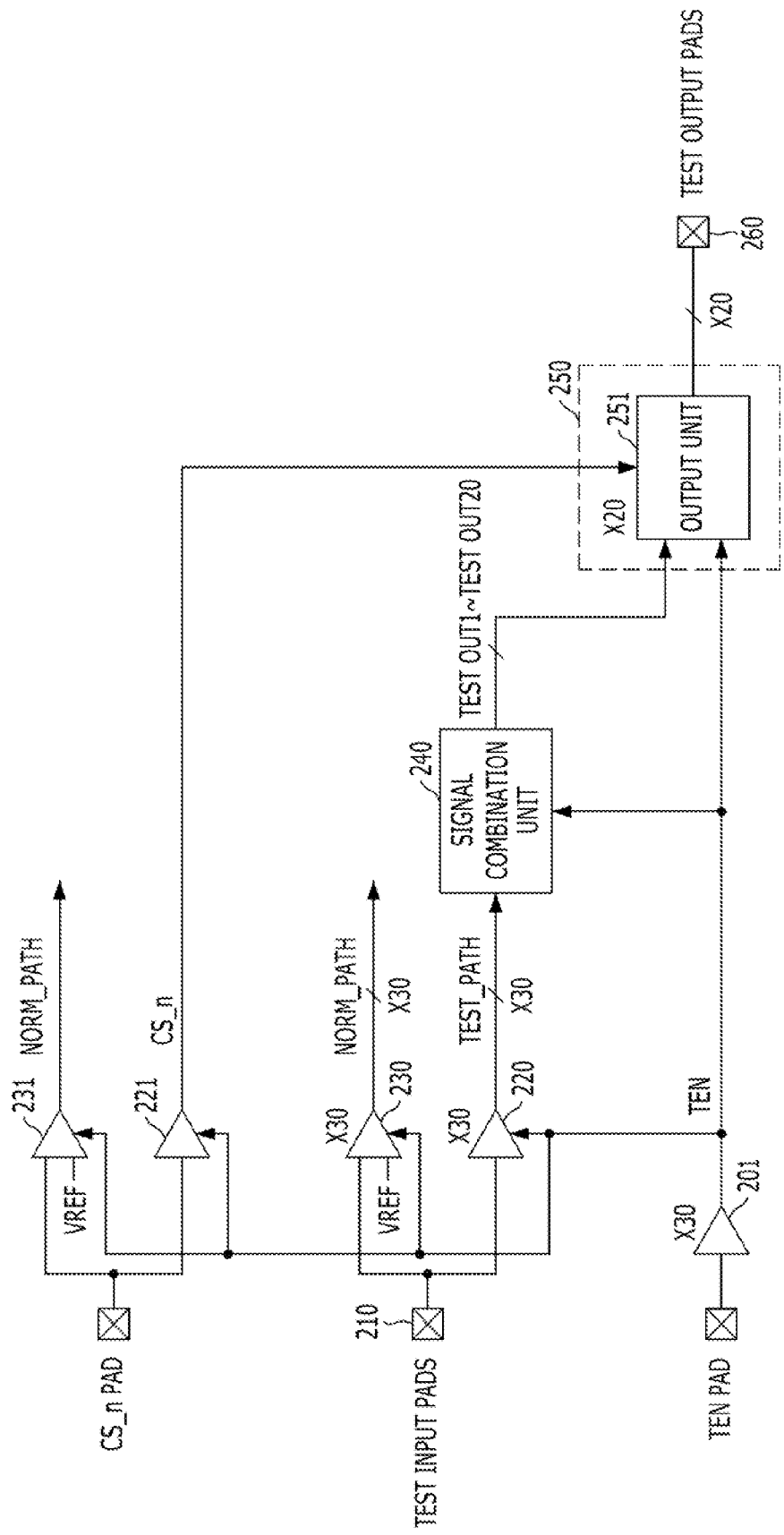
FIG. 2 is a diagram illustrating a memory device in accordance with an embodiment of the present invention.

FIG. 2 is a diagram illustrating the memory device in accordance with an embodiment of the present invention.

Referring to FIG. 2 the memory device includes a test enable pad TEN PAD, a chip select pad CS_n PAD, a plurality of test input pads 210, a plurality of single-ended type buffers 220 and 221, a plurality of differential-type buffers 230 and 231, a signal combination unit 240, an output circuit 250, and a plurality of test output pads 260.

A single-ended type buffer 201 is connected to the test enable pad TEN PAD and buffers a test enable signal TEN. The test enable signal TEN substantially maintains a 'high' level in the connectivity test mode, and substantially maintains a 'low' level in a normal operation. The single-ended type buffer 201 is designed in the form of a logic gate such as an inverter or a NAND gate. The single-ended type buffer 201 consumes a small amount of current as compared with a differential-type buffer, but does not recognize a high frequency signal. Since the test enable signal TEN is a low frequency signal that substantially maintains a 'high' level in a connectivity test operation and substantially maintains a 'low' level in the normal operation, there is no problem in receiving the test enable signal TEN through the single-ended type buffer 201.

The plurality of test input pads 210 include 30 numbers of pads. As described above, these pads 210 may be classified into the address pads BA0, BA1, BG0, A0 to A9, A10/AP, A11, A12/BC_n, and A13, the command pads WE_n/A14, CAS_n/A15, RAS_n/A16, and ACT_n, and the control pads CKE, ODT, CLK_t, CLK_c, DML_n/DBIL_n, DMU_n/DBIU_n, ALERT_n, PAR, and RESET_n.

The plurality of single-ended type buffers 220 and 221 receive signals input to the plurality of test input pads 210 and a signal input to the chip select pad CS_n PAD in the connectivity test mode. The received signals by the single-ended type buffer 220 through the test input pads 210 are transferred to the signal combination unit 240. The received signals by the single-ended type buffer 221 are transferred to the output circuit 250. The plurality of single-ended type buffers 220 and 221 are activated when the test enable signal TEN indicating the connectivity test mode is activated to a 'high' level, and deactivated when the test enable signal TEN has a 'low' level. The single-ended type buffers 220 and 221 consume a small amount of current as compared with the differential-type buffers 230 and 231, but the performance of the single-ended type buffers 220 and 221 is lower than that of the differential-type buffers 230 and 231. That is, in receiving a high frequency signal, the differential-type buffers 230 and 231 stably operate as compared with the single-ended type buffers 220 and 221. Since no high frequency signal is input to the test input pads 210 in the connectivity test mode, even when signals applied to the pads 210 through the single-ended type buffer 220 are received in the connectivity test mode, there is no problem in the operation.

The plurality of differential-type buffers 230 and 231 receive the signals input to the plurality of test input pads 210 and the chip select pad CS_n PAD in a normal mode (that is, when a current mode is not the connectivity test mode). The differential-type buffers 230 and 231 are activated when the test enable signal TEN indicating the connectivity test mode is activated to a 'low' level, and deactivated when the test enable signal TEN has a 'high' level. The differential-type buffers 230 and 231 compare signals received in the pads 210 and CS_n PAD with a reference voltage VREF, to recognize the received signals as 'high' level signals when the voltage levels of the received signals are higher than the reference voltage VREF, and to recognize the received signals as 'low' level signals when the voltage levels of the received signals are lower than the reference voltage VREF. The differential-type buffers 230 and 231 may have superior characteristics in receiving the high frequency signal as compared with the single-ended type buffers 220 and 221. However, since the differential-type buffers 230 and 231 include a differential amplifier having a current mirror, they consume a large amount of current as compared with the single-ended type buffers 220 and 221. The differential-type buffers 230 and 231 use the reference voltage VREF for comparison with the voltage levels of the received signals, wherein the reference voltage VREF is adjusted by setting information input from an exterior of the memory device. However, in the connectivity test mode, since most pads are used for the connectivity test operation, it may be not possible to receive setting information for setting the level of the reference voltage VREF. Consequently, in the connectivity test mode in which the level of the reference voltage VREF may be instable, the single-ended type buffers 220 and 221 stably operate as compared with the differential-type buffers 230 and 231.

Since the differential-type buffers 230 and 231 are used in the normal operation, signals received in the differential-type buffers 230 and 231 are transferred to a normal path NORM_PATH. Transferring the signals to the normal path NORM_PATH represents that signals input to the address pads BA0, BA1, BG0, A0 to A9, A10/AP, A11, A12/BC_n, and A13 are transferred to an address decoder (not illustrated), signals input to the command pads WE_n/A14 CAS_n/A15, RAS_n/A16 and ACT_n and the chip select pad CS_n PAD are transferred to a command decoder (not illustrated), and signals input to the control pads CKE, ODT, CLK_t, CLK_c, DML_n/DBIL_n, DMU_n/DBIU_n, and ALERT_n are transferred to a control circuit (not illustrated).

The signal combination unit 240 is configured to generate test output signals TEST_OUT1 to TEST_OUT20 using the test input signals transferred from the single-ended type buffer 220. The signal combination unit 240 logically combines the test input signals using XOR gates and inverters and generates the test output signals TEST_OUT1 to TEST_OUT20. Table 1 below shows logical combination methods for generating the test output signals TEST_OUT1 to TEST_OUT20 by locally combining the test input signals and test output pads to which the generated test output signals TEST_OUT1 to TEST_OUT20 are output. In Table 1 below, XOR (A,B,C) represents that test output signals may be generated by the XOR gate employing signals A, B, and C as input, and INV(D) represents that test output signals may be generated by inverting a signal D through the inverter.

TABLE 1

| test output signal | logical combination method | test output pad |
|---|---|---|
| TEST_OUT1 | XOR (A1, A6, PAR) | DQ0 |
| TEST_OUT2 | INV (TEST_OUT1) | DQ1 |
| TEST_OUT3 | XOR (A8, ALERT_n, A9) | DQ2 |
| TEST_OUT4 | INV (TEST_OUT3) | DQ3 |
| TEST_OUT5 | XOR (A2, A5, A13) | DQ4 |
| TEST_OUT6 | INV (TEST_OUT5) | DQ5 |
| TEST_OUT7 | XOR (A0, A7, A11) | DQ6 |
| TEST_OUT8 | INV (TEST_OUT7) | DQ7 |
| TEST_OUT9 | XOR (CLK_n, ODT, CAS_n/A15) | DQ8 |
| TEST_OUT10 | INV (TEST_OUT9) | DQ9 |
| TEST_OUT11 | XOR (CKE, RAS_n/A16, A10/AP) | DQ10 |
| TEST_OUT12 | INV TEST_OUT11) | DQ11 |
| TEST_OUT13 | XOR (ACT_n, A4, BA1) | DQ12 |
| TEST_OUT14 | INV (TEST_OUT13) | DQSL_c |
| TEST_OUT15 | XOR (DMU_n/DBIU_n, DML_N/DBIL_n, CLK_t) | DQ13 |
| TEST_OUT16 | INV (TEST_OUT15) | DQSU_c |
| TEST_OUT17 | XOR (WE_n/A14, A12/BC, BA0) | DQ14 |
| TEST_OUT18 | INV (TEST_OUT17) | DQ15 |
| TEST_OUT19 | XOR (BG0, A3, RESET_n) | DQSL_t |
| TEST_OUT20 | INV (TEST_OUT19) | DQSU_t |

The signal combination unit 240 receives the test enable signal TEN, wherein, at the time of activation of the test enable signal TEN, the signal combination unit 240 is activated, and at the time of deactivation of the test enable signal TEN the signal combination unit 240 is deactivated. The deactivation of the signal combination unit 240 may represent that the input of the test input signals to the signal combination unit 240 is interrupted, or the supply of power to the signal combination unit 240 is interrupted, The output circuit 250 outputs the test output signals TEST_OUT1 to TEST_OUT20 generated by the signal combination unit 240 to the plurality of test output pads 260. The output circuit 250 includes 20 output units 251, wherein each of the output units 251 may include a pipe latch and an output driver for signal output. As described above, the test output pads 260 include the 16 data pads DQ0 to DQ15 and the four strobe pads DQSU_t, DQSU_c, DQSL_t, and DQSL_c. With reference to Table 1 above, it may be possible to understand pads of the test output pads 260 to which the test output signals are output. The output circuit 250 is controlled by the chip select signals CS_n in a connectivity test mode period, that is, an activation period of the test enable signal TEN. In this period, when the chip select signals CS_n at a 'low' level is applied, the test output signals TEST_OUT1 to TEST_OUT20 are output to the test output, pads 260. Otherwise, the test output pads 260 are tri-stated. In a normal mode other than the connectivity test mode, the output circuit 250 outputs signals corresponding to purposes of the pads. For example, in the normal mode, the output circuit 250 outputs data to the data pads DQ0 to DQ15 while outputting a data strobe signal to the strobe pads DQSU_t, DQSU_c, DQSL_t, and DQSL_c.

A host (for example, a memory controller) connected to the memory device on a board transfers the test input signals to the test input pads 210 in the connectivity test mode, and checks the test output signals output from the memory device through the test output pads 260, thereby checking electrical connection states of the test input pads 210 and the test output pads 260.

According to this exemplary embodiment, the single-ended type buffers and the differential-type buffers are provided to the pads that receive signals required for a test in the connectivity test. In the connectivity test mode in which no high frequency signal is input to the pads and the level of the reference voltage is instable, the single-ended type buffers are used. In the normal mode in which the high frequency signal is input to the pads and the level of the reference voltage is stable, the differential-type buffers are used. That is, according to this embodiment, optimal buffers are selected for use according to a mode. Consequently, it may be possible to reduce current consumption of the memory device and simultaneously to perform a stable operation.

Figure 3:
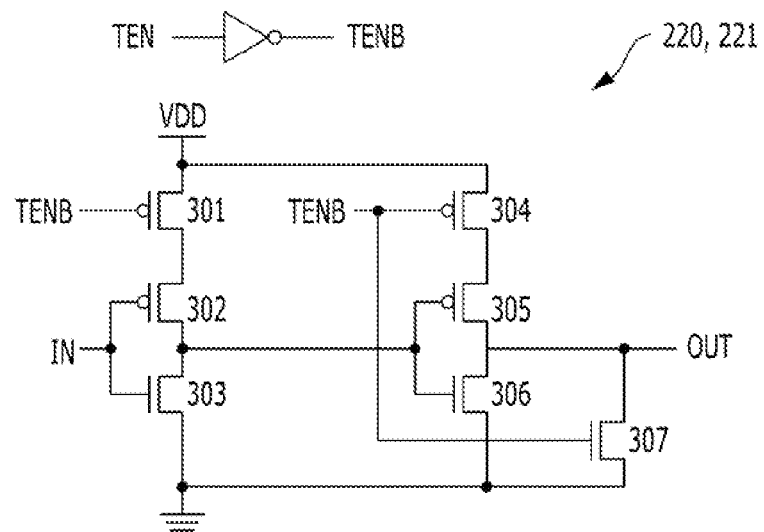
FIG. 3 is a diagram illustrating single-ended type buffers shown in FIG. 2 in accordance with an embodiment.

FIG. 3 is a diagram illustrating the single-ended type buffers 220 and 221 shown in FIG. 2 in accordance with an embodiment.

FIG. 3 illustrates only a buffer corresponding to one test input pad between the two single-ended type buffers 220 and 221 illustrated in FIG. 2.

Referring to FIG. 3, each of the single-ended type buffers 220 and 221 includes PMOS transistors 301, 302, 304, and 305 and NMOS transistors 303, 306, and 307.

When the test enable signal TEN is activated, that is, when a signal TENB is activated to a 'low' level, the PMOS transistors 301 and 304 are turned on, so that the buffer is activated. In the state in which the buffers have been activated, when a signal IN input to the test input pad has a high level, the NMOS transistor 303 and the PMOS transistor 305 are turned on, so that an output signal OUT of the buffer has a 'high' level. When the input signal IN has a low level, the PMOS transistor 302 and the NMOS transistor 306 are turned on, so that the output signal OUT of the buffer has a 'low' level. Such a single-ended type buffer consumes a small amount of current because it consumes current only when the logic level of the input signal IN is changed, but the single-ended type buffer has a disadvantage of exactly recognizing a logic value of a high frequency signal, that is, a logic value of a signal having a narrow swing width. FIG. 3 illustrates the most basic single-ended type buffer having a configuration substantially equal to that of an inverter. However, the single-ended type buffer may have various structures in which various logic gates are mixed.

Figure 4:
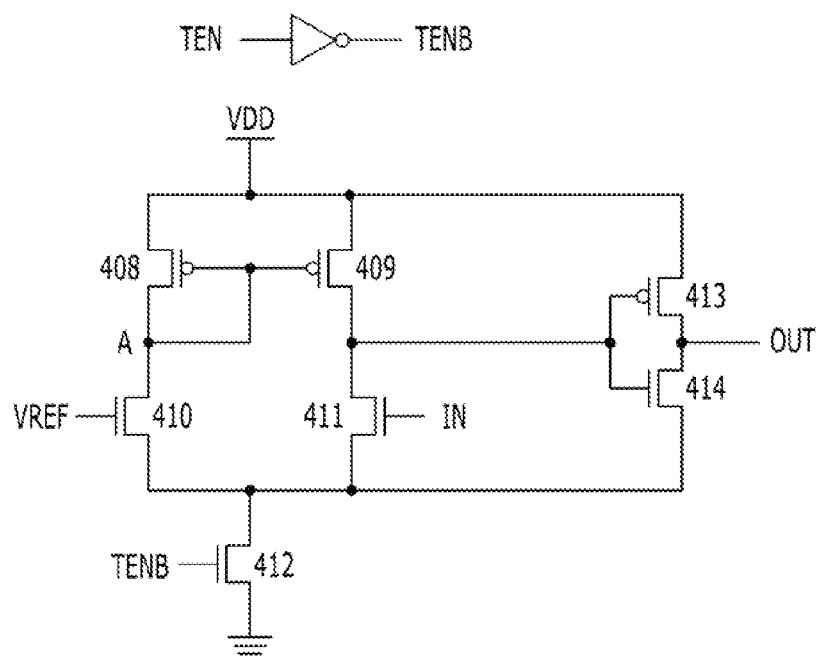
FIG. 4 is a diagram illustrating differential-type buffers shown in FIG. 2 in accordance with an embodiment.

FIG. 4 is a diagram illustrating the differential-type buffers 230 and 231 shown in FIG. 2 in accordance with an embodiment.

FIG. 4 illustrates only a buffer corresponding to one test input pad between the two differential-type buffers 230 and 231 illustrated in FIG. 2.

Referring to FIG. 4, each differential-type buffer has a differential amplifier structure of detecting a voltage difference between the input signal IN input to the test input pad and the reference voltage VREF. Two PMOS transistors 408 and 409 form a current mirror structure, so that substantially the same current is supplied to two nodes A and B and thus the two nodes A and B are differentially amplified by a potential difference between the reference voltage VREF input to a NMOS transistor 410 and the input signal IN input to a NMOS transistor 411. As a consequence, when the input signal IN has a voltage level higher than that of the reference voltage VREF, an output signal OUT has a 'high' level, and when the input signal IN has a voltage level lower than that of the reference voltage VREF, the output signal OUT has a 'low' level. Meanwhile, when the test enable signal TEN has a 'low' level, that is, when a signal TENB has a 'high' level, a NMOS transistor 412 is turned on. When the NMOS transistor 412 is turned on, current flows through the buffer, so that the buffer is activated. However, when the NMOS transistor 412 is turned off, no current flows through the buffer, so that the buffer is deactivated.

Such a differential-type buffer may exactly recognize the logic value of a signal even when the swing width of the input signal IN is narrow (that is, when the input signal is applied at a high speed), but consumes a relatively large amount current because current flows through the buffer at all times during the activation of the buffer. Furthermore, since the differential-type buffer detects the logic level of the input signal IN by comparing the level of the input signal IN with the level of the reference voltage VREF, when the level of the reference voltage VREF is instable or the reference voltage VREF has an abnormal level, it may be not possible for the differential-type buffer to stably operate. FIG. 4 illustrates the most basic differential-type buffer, and the differential-type buffer may have various structures different from the structure of FIG. 4.

Figure 5:
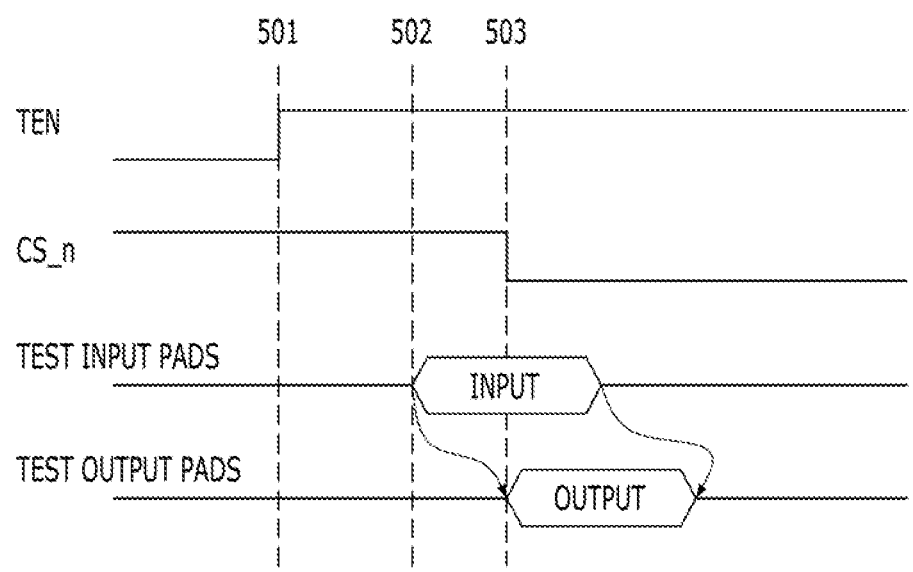
FIG. 5 is a timing diagram illustrating an operation of a memory device shown in FIG. 2 in a connectivity test mode.

FIG. 5 is a timing diagram illustrating an operation of the memory device shown in FIG. 2 in the connectivity test mode.

At a time point '501', the test enable signal TEN is activated to a 'high' level and the memory device enters the connectivity test mode. Then, the single-ended type buffers 220 and 221 are activated and the differential-type buffers 230 and 231 are deactivated in response to the activation of the test enable signal TEN.

At a time point '502', the test input signals input through the test input pads 210 are buffered through the single-ended type buffer 220 and then are transferred to the signal combination unit 240. Then, the signal combination unit 240 generates the test output signals TEST_OUT1 to TEST_OUT20 using the received test input signals.

At a time point '503', when the chip select signal CS_n is changed to a 'low' level, the output circuit 250 outputs the test output signals TEST_OUT1 to TEST_OUT20 through the test output pads 260.

While the present invention has been described with respect to the specific embodiments, it will be apparent to those skilled in the art that various changes and modifications may be made without departing from the spirit and scope of the invention as defined in the following claims.

Furthermore, in the aforementioned embodiment, the present invention is applied to the memory device. However, the present invention can be applied to all kinds of integrated circuit chips that test an electrical connection of pads, as well as the memory device. Furthermore, the type and number of pads used in the connectivity test may be changed according to an integrated circuit chip.

What is claimed is:

1. An integrated circuit chip comprising:
   a plurality of test input pads;
   a plurality of single-ended type buffers configured to receive a plurality of test input signals input to the plurality of test input pads in a connectivity test mode;
   a plurality of differential-type buffers configured to receive a plurality of signals input to the plurality of test input pads in a normal mode;
   a signal combination unit configured to combine the plurality of test input signals input through the plurality of single-ended type buffers, and to generate a plurality of test output signals; and
   a plurality of test output pads configured to output the plurality of test output signals in the connectivity test mode,
   wherein the plurality of differential-type buffers are configured to compare voltage levels of the plurality of signals input to the test input pads in a normal mode with a voltage level of a reference voltage.

2. The integrated circuit chip of claim 1, wherein the signal combination unit comprises:
   a plurality of XOR gates and a plurality of inverters configured to combine the plurality of test input signals input through the plurality of single-ended type buffers.

3. The integrated circuit chip of claim 1, further comprising:
   a test enable pad configured to receive a test enable signal,
   wherein the integrated circuit chip operates as the connectivity test mode when the test enable signal is activated, and operates as the normal mode when the test enable signal is inactivated.

4. An integrated circuit chip comprising:
   a plurality of test input pads;
   a plurality of single-ended type buffers configured to receive a plurality of test input signals input to the plurality of test input pads in a connectivity test mode;
   a plurality of differential-type buffers configured to receive a plurality of signals input to the plurality of test input pads in a normal mode;
   a signal combination unit configured to combine the plurality of test input signals input through the plurality of single-ended type buffers, and to generate a plurality of test output signals; and
   a plurality of test output pads configured to output the plurality of test output signals in the connectivity test mode.
   wherein, in the connectivity test mode, supply of current to the plurality of differential-type buffers is interrupted, and in the normal mode, supply of current to the plurality of single-ended buffers is interrupted.

5. A memory device comprising:
   a chip select pad;
   a plurality of control pads;
   a plurality of command pads;
   a plurality of address pads;
   a plurality of single-ended type buffers configured to receive a plurality of test input signals input to the chip select pad, the plurality of control pads, the plurality of command pads, and the plurality of address pads, in a connectivity test mode;
   a plurality of differential-type buffers configured to receive a plurality of signals input to the chip select pad, the plurality of control pads, the plurality of command pads, and the plurality of address pads, in a normal mode;
   a signal combination unit configured to combine the plurality of test input signals, which are input through single-ended type buffers corresponding to the plurality of control pads, the plurality of command pads, and the plurality of address pads, in the connectivity test mode, and to generate a plurality of test output signals; and
   an output circuit configured to output the plurality of test output signals through a plurality of data pads and a plurality of strobe pads in response to a chip select signal input through one of the single-ended type buffers corresponding to the chip select pad, in the connectivity test mode,
   wherein the plurality of differential-type buffers are configured to compare voltage levels of the signals input to pads, which are coupled to the plurality of differential-type buffers, with a voltage level of a reference voltage.

6. The memory device of claim 5, further comprising:
   a test enable pad configured to receive a test enable signal; and
   a single-ended type buffer configured to be connected to the test enable pad,
   wherein the memory device operates as the connectivity test mode when the test enable signal is activated, and operates as the normal mode when the test enable signal is inactivated.

7. The memory device of claim 5, wherein the signal combination unit comprises:

a plurality of XOR gates and a plurality of inverters configured to combine the plurality of test input signals.

8. The memory device of claim 5, wherein the plurality of control pads comprise:
a reset pad;
one or more data mask pads;
one or more data bus inversion pads;
one or more clock pads;
a clock enable pad;
a parity pad;
an on-die termination pad; and
an alert pad.

9. The memory device of claim 5, wherein the plurality of test output signals comprises first to twentieth test output signals, and
wherein the signal combination unit is configured to logically combine a first address signal, a sixth address signal, and a parity signal to generate the first test output signal,
to invert the first test output signal to generate the second test output signal,
to logically combine an eighth address signal, an alert signal, and a ninth address signal to generate the third test output signal,
to invert the third test output signal to generate the fourth test output signal,
to logically combine a second address signal, a fifth address signal, and a thirteenth address signal to generate the fifth test output signal,
to invert the fifth test output signal to generate the sixth test output signal,
to logically combine a 0 th address signal, a seventh address signal, and an eleventh address signal to generate the seventh test output signal,
to invert the seventh test output signal to generate the eighth test output signal,
to logically combine a clock bar signal, an on-die termination signal, and a column address strobe/fifteenth address signal to generate the ninth test output signal,
to invert the ninth test output signal to generate the tenth test output signal,
to logically combine a clock enable signal, a row address strobe/sixteenth address signal, and a tenth address/auto-precharge signal to generate the eleventh test output signal,
to invert the eleventh test output signal to generate the twelfth test output signal,
to logically combine an active signal, a fourth address signal, and a thirteenth address signal to generate the thirteenth test output signal,
to invert the thirteenth test output signal to generate the fourteenth test output signal,
to logically combine a data mask/data bus inversion up signal, a data mask/data bus inversion down signal, and a clock signal to generate the fifteenth test output signal,
to invert the fifteenth test output signal to generate the sixteenth test output signal,
to logically combine a write enable/fourteenth address signal, a twelfth address/burst chop signal, and a 0 th bank address signal to generate the seventeenth test output signal,
to invert the seventeenth test output signal to generate the eighteenth test output signal,
to logically combine a 0 th bank group address signal, a third address signal, and a reset signal with one another to generate the nineteenth test output signal, and to invert the nineteenth test output signal to generate the twentieth test output signal.

10. The memory device of claim 9, wherein the plurality of data pads comprises 0 th to fifteenth data pads and the plurality of strobe pads comprises four strobe pads,
and wherein the output circuit is configured to output the first to thirteenth test output signals, the fifteenth test output signal, the seventeenth test output signal, and the eighteenth test output signal to the 0 th to fifteenth data pads, and to output the fourteenth test output signal, the sixteenth test output signal, the nineteenth test output signal, and the twentieth test output signal to the four strobe pads.

11. A memory device comprising:
a chip select pad;
a plurality of control pads;
a plurality of command pads;
a plurality of address pads;
a plurality of single-ended type buffers configured to receive a plurality of test input signals input to the chip select pad, the plurality of Control pads, the plurality of command pads, and the plurality of address pads, in a connectivity test mode;
a plurality of differential-type buffers configured to receive a plurality of signals input to the chip select pad, the plurality of control pads, the plurality of command pads, and the plurality of address pads, in a normal mode;
a signal combination unit configured to combine the plurality of test input signals, which are input through single-ended type buffers corresponding to the plurality of control pads, the plurality of command pads, and the plurality of address pads, in the connectivity test mode, and to generate a plurality of test output signals; and
an output circuit configured to output the plurality of test output signals through a plurality of data pads and a plurality of strobe pads in response to a chip select signal input through one of the single-ended type buffers corresponding to the chip select pad, in the connectivity test mode,
wherein, in the connectivity test mode, supply of current to the plurality of differential-type buffers is interrupted, and in the normal mode, supply of current to the plurality of single-ended buffers is interrupted.

* * * * *